United States Patent
Ke

(10) Patent No.: US 10,833,106 B2
(45) Date of Patent: Nov. 10, 2020

(54) FLEXIBLE ARRAY SUBSTRATE, MANUFACTURING METHOD THEREOF, AND DISPLAY PANEL

(71) Applicant: WUHAN CHINA STAR OPTOELECTRONICS SEMICONDUCTOR DISPLAY TECHNOLOGY CO., LTD., Wuhan (CN)

(72) Inventor: Linbo Ke, Hubei (CN)

(73) Assignee: Wuhan China Star Optoelectronics Semiconductor Display Technology Co., Ltd., Hubei (CN)

(*) Notice: Subject to any disclaimer, the term of this patent is extended or adjusted under 35 U.S.C. 154(b) by 2 days.

(21) Appl. No.: 16/331,975

(22) PCT Filed: Jan. 21, 2019

(86) PCT No.: PCT/CN2019/072492
§ 371 (c)(1),
(2) Date: Mar. 10, 2019

(87) PCT Pub. No.: WO2020/113797
PCT Pub. Date: Jun. 11, 2020

(65) Prior Publication Data
US 2020/0235139 A1    Jul. 23, 2020

(30) Foreign Application Priority Data
Dec. 6, 2018 (CN) .......................... 2018 1 1486659

(51) Int. Cl.
*H01L 21/00* (2006.01)
*H01L 27/12* (2006.01)
(Continued)

(52) U.S. Cl.
CPC ...... *H01L 27/1262* (2013.01); *H01L 21/6835* (2013.01); *H01L 27/1218* (2013.01); *H01L 51/0097* (2013.01); *H01L 27/1244* (2013.01); *H01L 27/3244* (2013.01); *H01L 2221/68386* (2013.01); *H01L 2227/326* (2013.01)

(58) Field of Classification Search
CPC ............ H01L 27/1262; H01L 21/6835; H01L 27/1218; H01L 51/0097; H01L 27/1244; H01L 27/3244; H01L 2221/68386; H01L 2227/326
See application file for complete search history.

(56) References Cited

U.S. PATENT DOCUMENTS

2006/0273304 A1* 12/2006 Cok .................. H01L 51/524
257/40
2015/0029683 A1* 1/2015 Kim .................. H05K 1/028
361/749

(Continued)

FOREIGN PATENT DOCUMENTS

CN    106684243 A    5/2017
CN    107068862 A    8/2017

*Primary Examiner* — Richard A Booth
(74) *Attorney, Agent, or Firm* — Mark M. Friedman

(57) ABSTRACT

A flexible array substrate includes a flexible substrate. The flexible array substrate is divided into a non-bent area and a bent area. The flexible substrate extends from the non-bent area to the bent area, and the flexible substrate located in the bent area has a patterned structure.

9 Claims, 6 Drawing Sheets

(51) Int. Cl.
*H01L 21/683* (2006.01)
*H01L 51/00* (2006.01)
H01L 27/32 (2006.01)

(56) References Cited

U.S. PATENT DOCUMENTS

| | | |
|---|---|---|
| 2016/0181572 A1 | 6/2016 | Prushinskiy et al. |
| 2017/0278900 A1* | 9/2017 | Yang .................... H01L 51/0097 |
| 2018/0102399 A1* | 4/2018 | Cho ..................... H01L 51/0097 |
| 2018/0233682 A1 | 8/2018 | Lin et al. |

* cited by examiner

FLEXIBLE ARRAY SUBSTRATE, MANUFACTURING METHOD THEREOF, AND DISPLAY PANEL

BACKGROUND OF INVENTION

1. Field of Invention

The present invention relates to a technology field of displays, and particularly, to a flexible array substrate, manufacturing method thereof, and a display panel.

2. Related Art

With rapid progress made in modern display technology, a technical field of displays has moving towards being lighter, thinner, softer, and more transparent. Traditional glass substrates, due to characteristics of their own hardness and brittleness, no longer satisfy flexible display technology requirements in the long run, whereas polymer film substrates, having characteristics of being light in weight, flexibility, and excellent comprehensive performance, can well satisfy the flexibility requirements of display technology. Therefore, a flexible polymer substrate material is the preferable material for flexible display technology in the future.

Currently, the most promising polymer material used for flexible substrates is polyimide. Polyimide has features of excellent heat resistance, radiation resistance, chemical resistance, electrical insulation, mechanical properties, etc. But after thin film transistors (TFTs) are formed on the flexible substrates, a stress neutral layer and a metal wiring layer area are not uniformly formed, giving rise to problems that stress is prone to be concentrated in a bent area, and a metal trace is bent and broken.

SUMMARY OF INVENTION

An object of the present invention is to provide a flexible array substrate, a manufacturing method thereof, and a display panel. The flexible array substrate utilizes the patterned filling layer to reduce the thickness of the flexible substrate in the bent area, and utilizes the release layer to separate the flexible substrate and the filling layer to enable a metal wiring layer in the bent area to be formed to face a stress neutral surface, thereby to realize a flexible array substrate having excellent bending performance. While maintaining the excellent performance of the polyimide material, the flexible substrate in the bent area is thinned to improve bending performance of the flexible array substrate in the bent area, thereby avoiding problems of an increase of possible internal stress in the bent area, and metal wire bending and fracture.

In one aspect of the present invention, the present invention provides a flexible array substrate, comprising a flexible substrate, and the flexible array substrate is divided into a non-bent area and a bent area, the flexible substrate extends from the non-bent area to the bent area, and the flexible substrate located in the bent area has a patterned structure.

In one embodiment of the present invention, the flexible substrate located in the bent area has a thickness less than a thickness of the flexible substrate located in the non-bent area.

In one embodiment of the present invention, the flexible substrate comprises: a first flexible sub-substrate, an inorganic layer, and a second flexible sub-substrate all laminated with each other in sequence; and the first flexible substrate in the bent area configured with a groove being concave towards the inorganic layer such that a thickness of the flexible substrate in the bent area is less than a thickness of the flexible substrate in the non-bent area.

In one embodiment of the present invention, the groove has an opening being rectangular in shape, inverted trapezoidal in shape, or semi-cylindrical in shape.

In another aspect of the present invention, the present invention provides a method of manufacturing the flexible array substrate, and the method comprises steps of: (1) providing a supporting substrate, and forming a filling layer by coating an organic material on the supporting substrate; (2) depositing a release layer on the filling layer, and patterning the filling layer and the release layer located in the bent area; (3) covering the supporting substrate and the release layer with a first flexible sub-substrate; (4) depositing an inorganic layer on the first flexible sub-substrate, and forming the second flexible sub-substrate on the inorganic layer; (5) forming a thin-film transistor layer on the second flexible sub-substrate; and (6) separating, by utilizing a laser lift-off technique, the supporting substrate and the first flexible sub-substrate.

In one embodiment of the present invention, in the step (1), the organic material is one of polyethylene terephthalate and polycarbonate.

In one embodiment of the present invention, in the step (1), the organic material used for the filling layer has viscosity of 1000 to 3000 mPa'sec and a thermal decomposition temperature of more than 450 degrees.

In one embodiment of the present invention, in the step (2), the release layer is made of silicon dioxide or silicon nitride.

In one embodiment of the present invention, in the step (4), the inorganic layer is a silicon dioxide structure or a stacked structure of silicon dioxide and silicon nitride.

In another aspect of the present invention, the present invention provides a display panel, comprising the flexible array substrate as mentioned above.

Advantages of the present invention are as follows: the flexible array substrate, the manufacturing method thereof, and the display panel. The flexible array substrate utilizes the patterned filling layer to reduce the thickness of the flexible substrate in the bent area, and utilizes the release layer to separate the flexible substrate and the filling layer to enable a metal wiring layer in the bent area to be formed to face a stress neutral surface, thereby to realize a flexible array substrate having excellent bending performance. While maintaining the excellent performance of the polyimide material, the flexible substrate in the bent area is thinned to improve bending performance of the flexible array substrate in the bent area, thereby avoiding problems of an increase of possible internal stress in the bent area, and metal wire bending and fracture. Additionally, the structure of the flexible array substrate satisfies requirements of high flexibility, heat resistance, high resistance to water and oxygen, and thus has broad development prospects.

BRIEF DESCRIPTION OF DRAWINGS

To describe the technical solutions in the embodiments of the present invention, the following briefly introduces the accompanying drawings for describing the embodiments. Apparently, the accompanying drawings in the following description show merely some embodiments of the present invention, and a person skilled in the art may still derive other drawings from these accompanying drawings without creative efforts.

DESCRIPTION OF PREFERRED EMBODIMENTS

Figure 1:
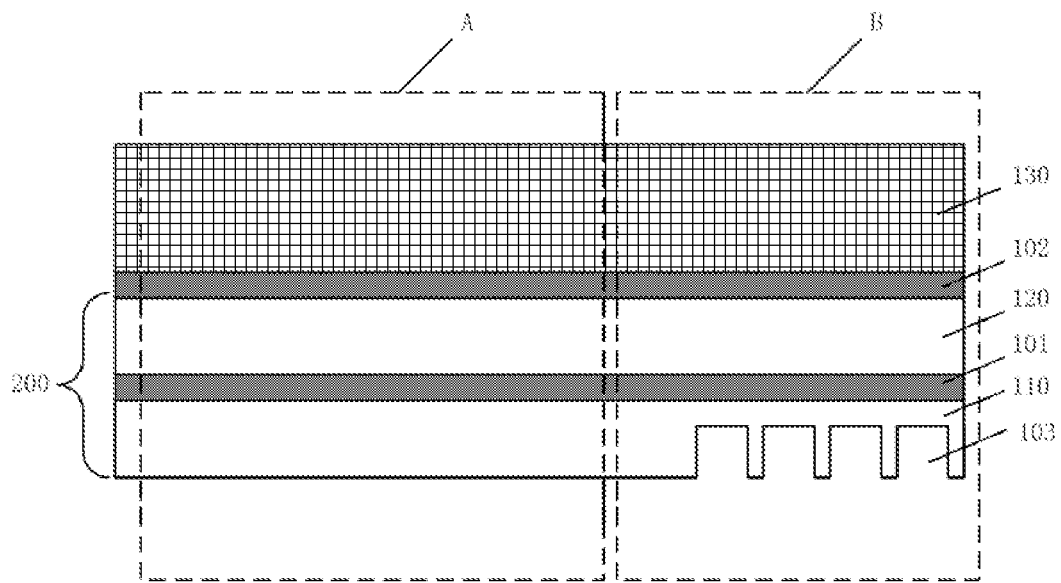
FIG. 1 is a schematic structural view of a flexible array substrate in accordance with an embodiment of the present invention.

Hereafter, embodiments of the present invention will be described in detail with reference to the accompanying drawings. Apparently, the accompanying drawings in the following description show merely some, but not all, embodiments of the present invention. All other embodiments obtained by a person skilled in the art based on the embodiments of the present invention without creative efforts are within the scope of the present invention.

The terms "first", "second", "third", etc. (if present) in the specification and claims of the present invention and the above figures are used to distinguish similar objects, and are not necessarily used to describe a specific order or priority. It should be understood that the objects so described are interchangeable where appropriate. Moreover, the terms "comprise" and "have" and any variations thereof are intended to cover a non-exclusive inclusion.

The drawings discussed below and the various embodiments used to describe the principles of the present invention are intended to be illustrative only and not to limit the scope of the invention. Those skilled in the art will appreciate that the principles of the present invention can be implemented in any suitably arranged system. Exemplary embodiments will be described in detail, examples of which are illustrated in the accompanying drawings. Further, a terminal according to an exemplary embodiment will be described in detail with reference to the accompanying drawings. The same reference numerals in the drawings denote the same elements.

The terms used in the description of the present invention are intended to describe a particular embodiment, and are not intended to illustrate the concept of the invention. Expressions used in the singular encompass the plural form of expression unless the context clearly dictates otherwise. In the description of the present invention, it is to be understood that the terms such as "include", "have", and "include" are intended to describe the possibility of one or more other features, numbers, steps, actions, or combinations disclosed in the present invention, and are not intended to exclude the possibility that one or more other features, numbers, steps, acts, or combinations thereof may be added. The same reference numerals in the drawings denote the same parts.

An embodiment of the present invention provides a flexible array substrate, a manufacturing method thereof, and a display panel. Detailed description will be given below.

Figure 2A:
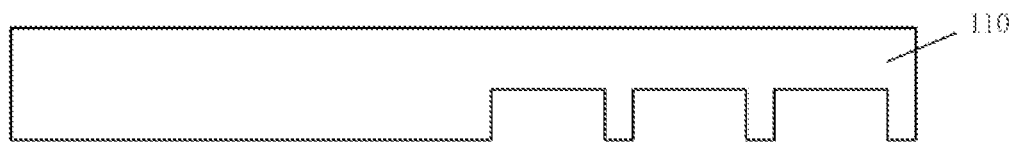
FIGS. 2A to 2C are schematic structural views showing a first flexible sub-substrate of the flexible array substrate of the embodiment of the present invention.
Figure 2B:
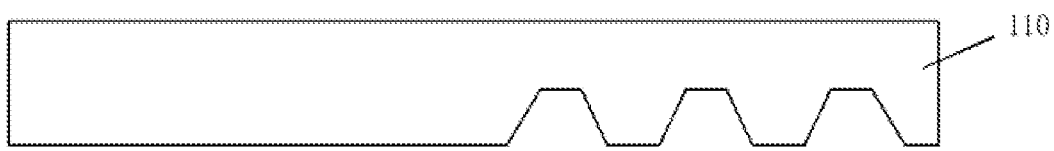
Figure 2C:
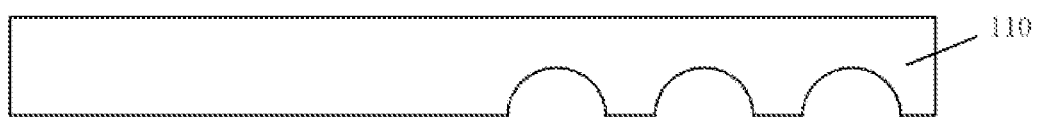

Please refer to FIG. 1. FIG. 1 is a schematic structural view of a flexible array substrate in accordance with an embodiment of the present invention. FIGS. 2A to 2C are schematic structural views showing a first flexible sub-substrate of the flexible array substrate of the embodiment of the present invention.

The present invention provides a flexible array substrate, including a flexible substrate 200. The flexible substrate 200 is divided into a non-bent area A and a bent area B. The flexible substrate 200 extends from the non-bent area A to the bent area B, and the flexible substrate 200 located in the bent area B has a patterned structure.

In the embodiment, the flexible substrate 200 includes a first flexible sub-substrate 110, an inorganic layer 101, and a second flexible sub-substrate 120 all laminated with each other in sequence. In this embodiment, the flexible substrate 200 is exemplified as a two-layered flexible sub-substrate, or in other embodiments, the flexible substrate 200 may also include a multi-layered flexible sub-substrate.

The first flexible sub-substrate 110 and the second flexible sub-substrate 120 are both made of an organic material, such as polyethylene terephthalate or polycarbonate. In this embodiment, polyimide is used because of its advantages of high temperature resistance, a wide temperature range, no obvious melting points, high insulation performance, and a stable dielectric constant.

The inorganic layer 101 may be a water and oxygen barrier layer to prevent external water or oxygen from entering the flexible substrate to adversely affect a lifespan of the flexible substrate. The inorganic layer 101 is a silicon dioxide structure or a stacked structure of silicon dioxide and silicon nitride.

The first flexible sub-substrate 110 in the bent area B is configured with a groove 103 being concave towards the inorganic layer 101 such that a thickness of the flexible substrate 200 in the bent area B is less than a thickness of the flexible substrate 200 in the non-bent area A. The groove 103 has an opening being rectangular in shape, inverted trapezoidal in shape, or semi-cylindrical in shape.

A height difference is created between the flexible substrate 200 in the non-bent area A and the first flexible sub-substrate 110 in the bent area B because of the patterned structure of the first flexible sub-substrate 110 in the bent area B. That is, the thickness of the flexible substrate 200 in the bent area B is less than the thickness of the flexible substrate 200 in the non-bent area A. In this manner, the flexible substrate 200 in the bent area B is thinned.

Figure 3:
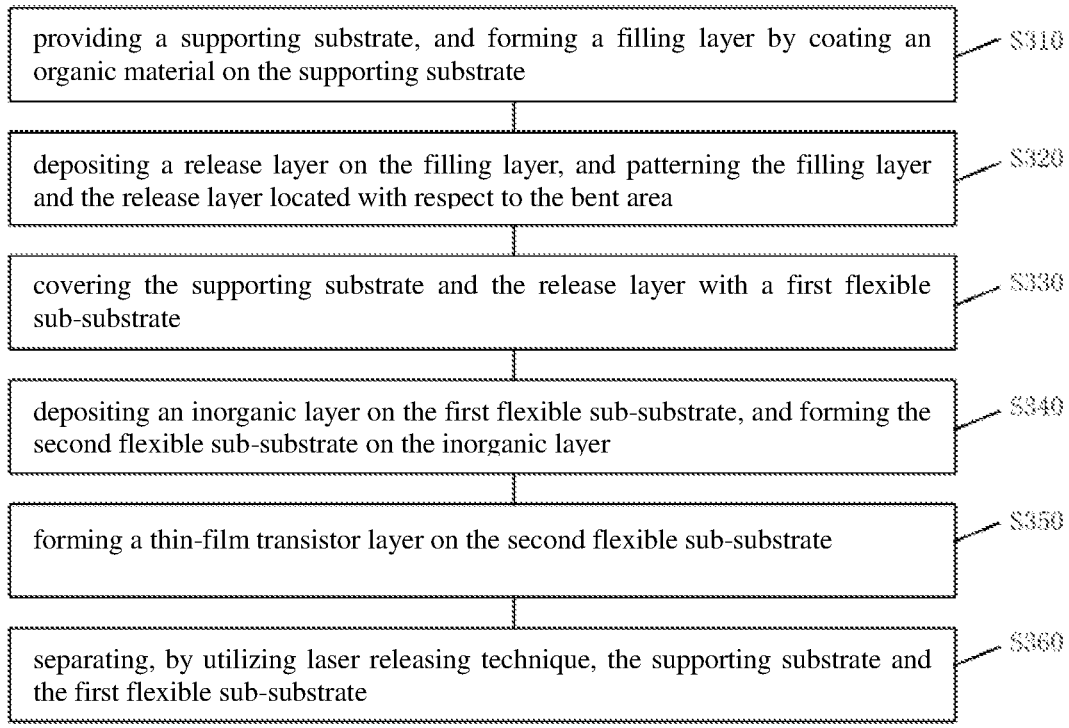
FIG. 3 is a flowchart of a method of manufacturing a flexible array substrate in accordance with an embodiment of the present invention.
Figure 4A:
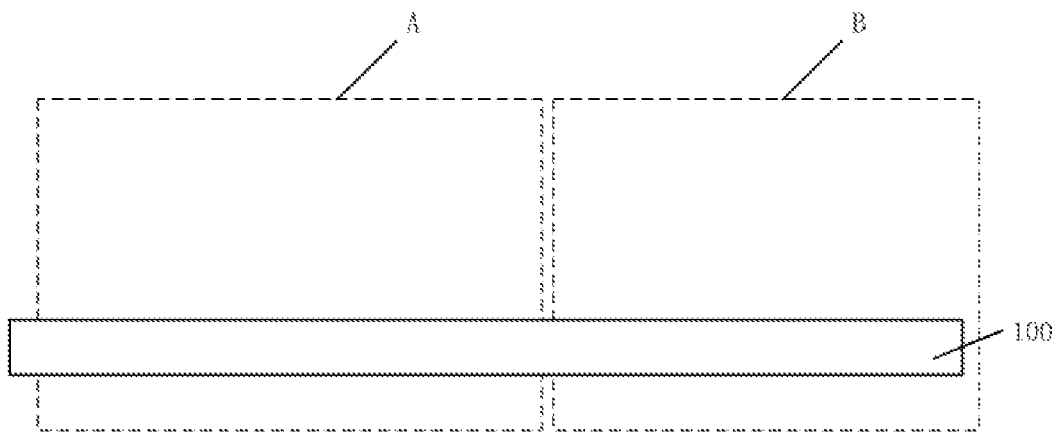
FIGS. 4A to 4I are schematic process views showing the method of manufacturing the flexible array substrate of the embodiment of the present invention.
Figure 4B:
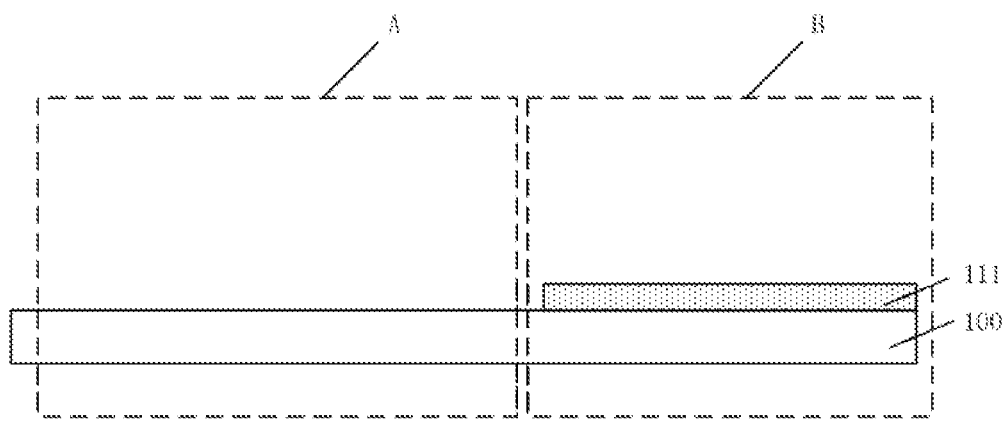
Figure 4C:
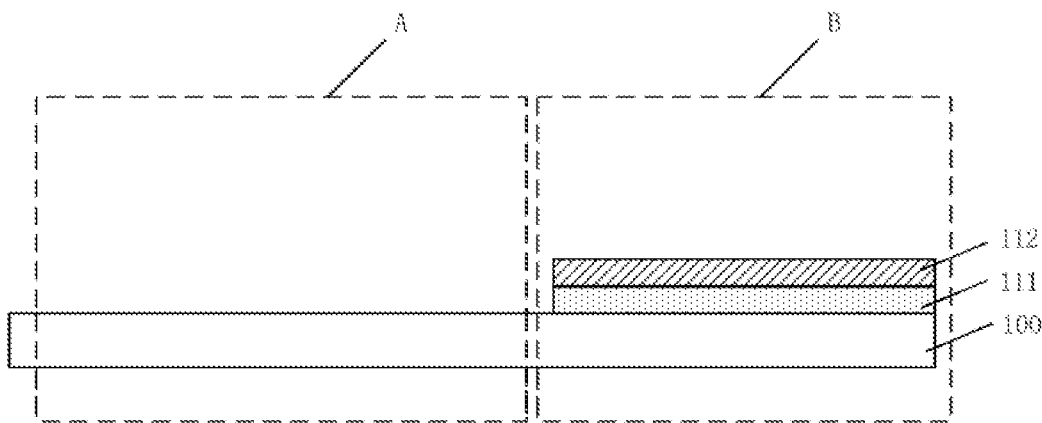
Figure 4D:
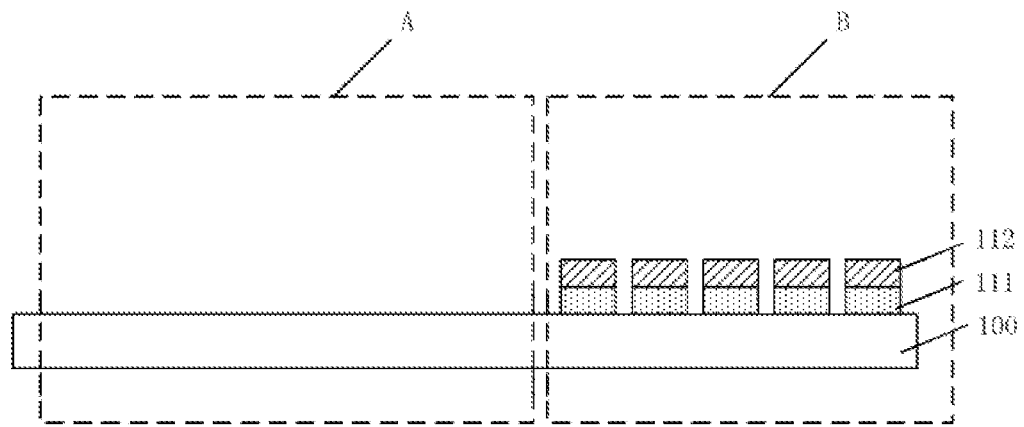
Figure 4E:
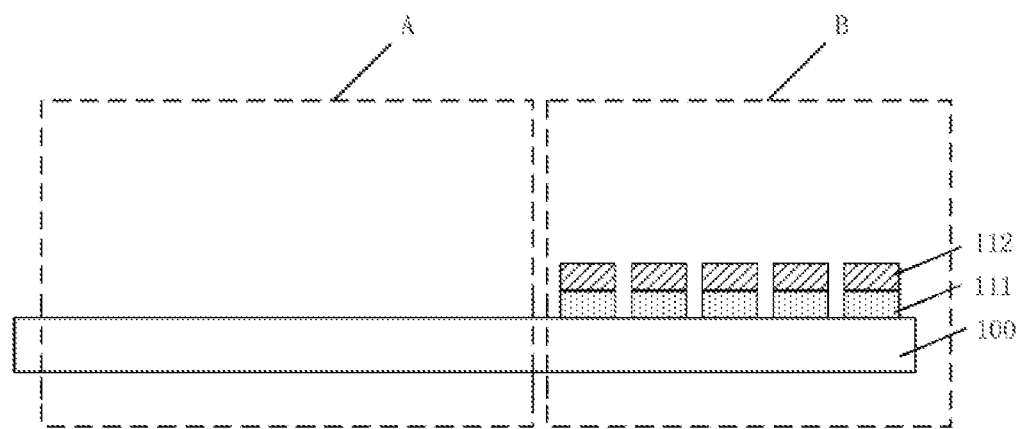
Figure 4F:
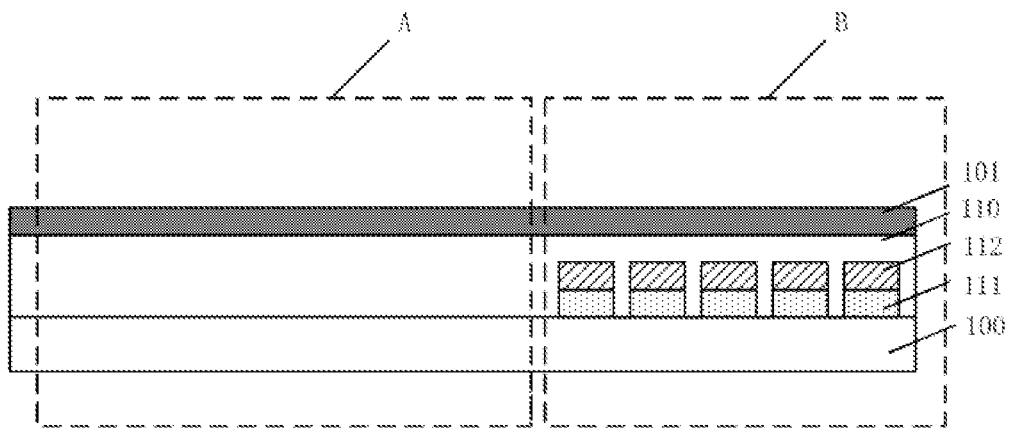
Figure 4G:
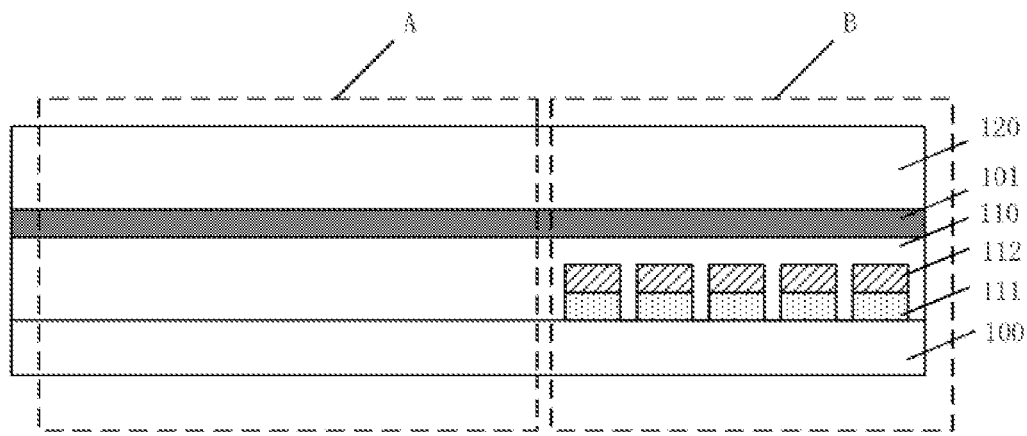
Figure 4H:
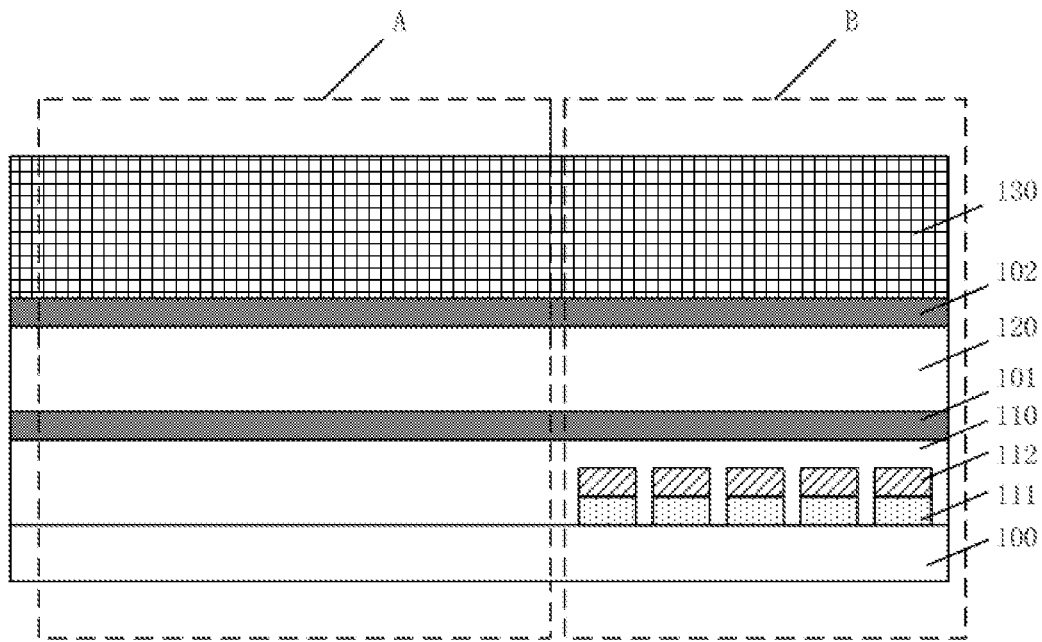
Figure 4I:
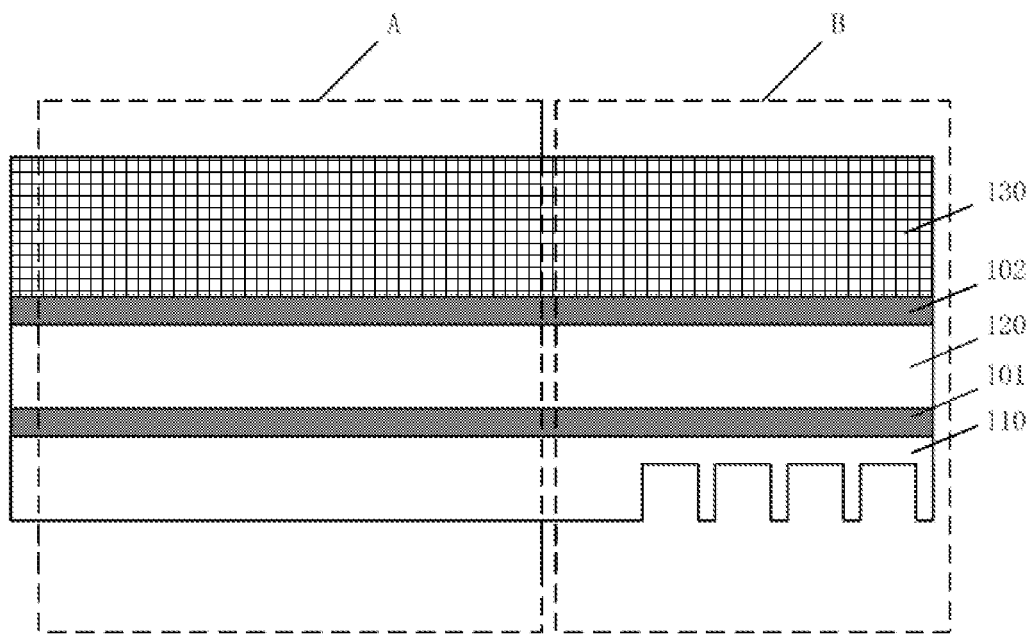

Please refer to FIG. 3, FIGS. 4A to 4I. FIG. 3 is a flowchart of a method of manufacturing a flexible array substrate in accordance with an embodiment of the present invention. FIGS. 4A to 4I are schematic process views showing the method of manufacturing the flexible array substrate of the embodiment of the present invention.

The present invention provides a method of manufacturing the flexible substrate, and the method includes following steps:

Step S310: providing a supporting substrate, and forming a filling layer by coating an organic material on the supporting substrate. The supporting substrate 100 is made of one of glass, metal, and non-metal. In this step, the organic material is uniformly coated on a clean and smooth supporting substrate, and baked to form the filling layer 111, wherein the organic material is one of polyethylene terephthalate and polycarbonate. The organic material used for the filling layer 111 has viscosity of 1000 to 3000 mPa'sec and a thermal decomposition temperature of more than 450 degrees. Furthermore, when the organic material is coated, a wet film is formed to have a thickness of 30 to 100 micrometers, the film formation temperature is 200 to 400 degrees, and the film formation time is 0.1 to 1 hour. The wet film is baked to form the filling layer 111.

Step S320: depositing a release layer on the filling layer, and patterning the filling layer and the release layer located in the bent area.

Material used for the release layer 112 is one of silicon dioxide and silicon nitride. The release layer 112 is deposited to a thickness of from 1000 angstroms to 3000 angstroms. Dry etching is performed for patterning. The patterned remaining filling layer 111 and the release layer 112 remained after being patterned have a width of 0.1 mm to 1 mm.

Step S330: covering the supporting substrate 100 and the release layer 112 with the first flexible sub-substrate 110. This step further includes uniformly coating the supporting substrate 100 and the release layer 112 with a polyamic acid solution, baking them at a low temperature to form a film, and removing the organic solvent. In a high-purity nitrogen atmosphere, the film is heated and dehydrated, and a high-temperature thermal imidization reaction occurs, so that the first flexible sub-substrate 110 is fabricated, i.e., a first polyimide layer. When a wet film is formed by coating to have a thickness of 50 micrometers to 300 micrometers, a baking temperature is 20 degrees to 80 degrees, and baking time is 1 minute to 20 minutes. When the temperature is heated and dehydrated, the heating rate is 5 to 20 degrees per minute, a curing temperature is 350 to 550° C., a curing time is 0.1 to 1 hour, and then the wet film is cooled to a room temperature.

Step S340: depositing the inorganic layer 101 on the first flexible sub-substrate 110, and forming the second flexible sub-substrate 120 on the inorganic layer 101.

In the step S340, the inorganic layer 101 is a first barrier layer, and the first barrier layer is a silicon dioxide structure or a stacked structure of silicon dioxide and silicon nitride. The first barrier layer has a thickness of 1000 to 6000 angstroms. After forming the first barrier layer, the second flexible sub-substrate 120 is formed on the first barrier layer. A method of forming the second flexible sub-substrate 120 is the same as the method in step S330, wherein the thickness of the wet film, the baking temperature, and the baking time are the same as those of the embodiment in step S330.

Step S350: forming a thin-film transistor layer 130 on the second flexible sub-substrate 120.

After the second flexible sub-substrate 120 is formed, a second barrier layer 102 may be further formed on the second flexible sub-substrate 120 (i.e., a second polyimide film layer). The method of forming the second barrier layer 102 is the same as the method of forming the inorganic layer 101 (i.e., the first barrier layer) in step S340, including a temperature increasing rate, the curing temperature, and the curing time.

Step S360: separating, by utilizing a laser lift-off technique, the supporting substrate and the first flexible sub-substrate. The supporting substrate 100 and the first flexible sub-substrate 110 are separated from each other by the laser lift-off technique. Specifically, separate the filling layer 111 on the supporting substrate 100 from the first flexible sub-substrate 110. Due to a Van der Waals force and hydrogen bonding of the release layer 112, the first flexible sub-substrate 110 and the filling layer 111 both temporarily adhered are separated by high temperature heating, thereby realizing the thinning of the flexible substrate 200 in the bent area B. After the flexible substrate 200 in the bent area B is thinned, a metal wiring layer (not shown) in the bent area B can be made to face a stress neutral surface, thereby improving performance of a thin-film transistor layer 130 in the bent area B. Furthermore, the thickness of the flexible substrate 200 in the bent area B is capable of being reduced by patterning the filling layer 111, such that the first flexible sub-substrate 110 is patterned. A height difference is formed by patterning the filling layer 111, thereby to realize the thinning of the flexible substrate 200 in the bent area B. Material of the filling layer 111 is generally a high-temperature resistant organic material of a low viscosity, which facilitates controlling the thickness of the filling layer 111 through a coating method, thereby achieving the control of reducing the thickness of the flexible substrate 200 in the bent area B. Particularly, a technique of patterning the fill layer 111 and the release layer 112 is a dry etching, and the control of the thickness of the flexible substrate 200 in the bent area B is achieved by an etch depth and an etch rate.

Hereinafter, in an embodiment, a method of manufacturing a flexible array substrate will be further described, and the method includes the following steps:

Apply polycarbonate with viscosity of 3000 mPa'sec to a clean, smooth glass substrate, a thickness of the wet film is 60 μm, and is baked at 350° C. for 10 minutes to form an organic filler layer.

Deposit a release layer of 2000 angstroms on the filling layer; the release layer is made of silicon dioxide.

The filling layer and the release layer are subjected to a dry etching process to form a 0.5 mm rectangular multi-patterned structure. Certainly, in other embodiments, the patterned structure may be trapezoidal in shape, or semi-cylindrical in shape. Therefore, the first flexible sub-substrate formed though the following steps has a groove having an opening being rectangular in shape, inverted trapezoidal in shape, or semi-cylindrical in shape.

The polyamic acid solution is uniformly coated on the filling layer and the release layer, and a thickness of the wet film is 200 μm and is baked at 40 degrees for 10 minutes to remove an organic solvent.

In a high-purity hydrogen atmosphere, a temperature is raised to 450 degrees for 0.5 hour at a rate of 5 degrees per minute, and a thermal imidization reaction occurred to form a first polyimide film layer, that is, the first flexible sub-substrate 110.

A barrier layer having a thickness of 5000 angstroms is deposited on the first polyimide film layer. The barrier layer is made of silicon dioxide.

The polyamic acid solution is uniformly coated on the barrier layer, and a thickness of the wet film is 200 μm and is baked at 40 degrees for 20 minutes to remove an organic solvent.

In a high-purity hydrogen atmosphere, a temperature is raised to 450 degrees for 0.5 hour at a rate of 5 degrees per minute, and a thermal imidization reaction occurred to form a second polyimide film layer, that is, the second flexible sub-substrate 120.

Deposit a second barrier layer on the second polyimide film layer.

Fabricate a thin-film transistor layer and an organic light emitting diode layer on the barrier layer.

Peel a support layer and the first polyimide film layer by using laser lift-off (LLO) technology.

Therefore, a certain thickness of the filling layer 111 and the release layer 112 is coated, patterned in the bent area B, and a polyimide material is coated thereon and cured to form the first flexible sub-substrate 110, and then deposit again to form the barrier layer. A two-layered or multi-layered flexible array substrate structure is formed by two or more times of polyimide coating and deposition of a barrier layer process, thereby fabricating a complete thin-film transistor layer 130 structure. Furthermore, the first flexible sub-substrate 110 and the filling layer 111 are separated by the release layer 112 to achieve thinning of the flexible substrate 200 in the bent area B.

In another aspect of the present invention, the present invention provides a display panel, including the flexible array substrate. The specific structure of the flexible array substrate will not be repeated herein.

Advantages of the present invention are as follows: the flexible array substrate, the manufacturing method thereof, and the display panel. The flexible array substrate utilizes the patterned filling layer 111 to reduce the thickness of the flexible substrate 200 in the bent area B, and utilizes the release layer 112 to separate the flexible substrate 200 and the filling layer 111 to enable a metal wiring layer in the bent area B to be formed to face a stress neutral surface, thereby to realize the flexible array substrate having excellent bending performance. While maintaining the excellent performance of the polyimide material, the flexible substrate 200 in the bent area B is thinned to improve bending performance of the flexible array substrate in the bent area B, thereby avoiding problems of an increase of possible internal stress in the bent area B, and bending and fracture of metal wires. Additionally, the structure of the flexible array substrate satisfies requirements of high flexibility, heat resistance, high resistance to water and oxygen, and thus has broad development prospects.

The exemplary embodiments described herein are to be considered as illustrative only. Those skilled in the art without departing from the principle of the present invention may make various changes or modifications, and thus the scope of the present invention should be after the appended claims and their equivalents.

The subject matter of the present application is feasible to be manufactured and used in the industry, and thus has the industrial applicability.

What is claimed is:

1. A flexible array substrate, comprising: a flexible substrate, wherein the flexible array substrate is divided into a non-bent area and a bent area, the flexible substrate extends from the non-bent area to the bent area, and the flexible substrate located in the bent area has a patterned structure;
    wherein the flexible substrate comprises a first flexible sub-substrate, an inorganic layer, and a second flexible sub-substrate all laminated with each other in sequence; and the first flexible sub-substrate in the bent area configured with a groove being concave towards the inorganic layer such that a thickness of the flexible substrate in the bent area is less than a thickness of the flexible substrate in the non-bent area.

2. The flexible array substrate of claim 1, wherein the flexible substrate located in the bent area has a thickness less than a thickness of the flexible substrate located in the non-bent area.

3. The flexible array substrate of claim 1, wherein the groove has an opening being rectangular in shape, inverted trapezoidal in shape, or semi-cylindrical in shape.

4. A method of manufacturing the flexible array substrate of claim 1, wherein the method comprises steps of:
    (1) providing a supporting substrate, and forming a filling layer by coating an organic material on the supporting substrate;
    (2) depositing a release layer on the filling layer, and patterning the filling layer and the release layer located in the bent area;
    (3) covering the supporting substrate and the release layer with a first flexible sub-substrate;
    (4) depositing an inorganic layer on the first flexible sub-substrate, and forming the second flexible sub-substrate on the inorganic layer;
    (5) forming a thin-film transistor layer on the second flexible sub-substrate; and
    (6) separating, by utilizing a laser lift-off technique, the supporting substrate and the first flexible sub-substrate.

5. The manufacturing method of claim 4, wherein in the step (1), the organic material is one of polyethylene terephthalate and polycarbonate.

6. The manufacturing method of claim 4, wherein in the step (1), the organic material used for the filling layer has a viscosity of 1000 to 3000 mPa·sec and a thermal decomposition temperature of more than 450 degrees.

7. The manufacturing method of claim 4, wherein in the step (2), the release layer is made of silicon dioxide or silicon nitride.

8. The manufacturing method of claim 4, wherein in the step (4), the inorganic layer is a silicon dioxide structure or a stacked structure of silicon dioxide and silicon nitride.

9. A display panel, comprising the flexible array substrate of claim 1.

* * * * *